United States Patent
Derderian

(10) Patent No.: US 6,861,693 B2
(45) Date of Patent: Mar. 1, 2005

(54) CONTINUOUS GOOD STEP COVERAGE CVD PLATINUM METAL DEPOSITION

(75) Inventor: Garo J. Derderian, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/373,355

(22) Filed: Aug. 12, 1999

(65) Prior Publication Data

US 2002/0000591 A1 Jan. 3, 2002

Related U.S. Application Data

(62) Division of application No. 09/121,528, filed on Jul. 23, 1998.

(51) Int. Cl.$^7$ .................. H01L 27/108; H01L 29/76; H01L 29/94; H01L 31/119
(52) U.S. Cl. ....................... 257/306; 257/310
(58) Field of Search ................ 257/295–310; 438/3, 245–253, 396–399

(56) References Cited

U.S. PATENT DOCUMENTS

| | | | |
|---|---|---|---|
| 5,214,302 A | 5/1993 | Uchida et al. | |
| 5,320,978 A | 6/1994 | Hsu | |
| 5,381,302 A | 1/1995 | Sandhu et al. | |
| 5,494,704 A | 2/1996 | Ackerman | |
| 5,506,166 A | 4/1996 | Sandhu et al. | |
| 5,572,052 A | 11/1996 | Kashihara et al. | |
| 5,578,867 A | * 11/1996 | Argos, Jr. et al. | 257/295 |
| 5,696,384 A | 12/1997 | Ogi et al. | |
| 5,751,019 A | 5/1998 | Fair | |
| 5,767,541 A | * 6/1998 | Hanagasaki | 257/295 |
| 5,783,716 A | * 7/1998 | Baum et al. | 556/136 |
| 5,838,605 A | * 11/1998 | Bailey | 257/295 |
| 5,985,757 A | * 11/1999 | Lee et al. | 438/650 |
| 6,054,331 A | * 4/2000 | Woo et al. | 438/3 |
| 6,265,738 B1 | * 7/2001 | Hayashi et al. | 257/295 |

OTHER PUBLICATIONS

"Low–temperature organometallic chemical vapor deposition of platinum", by Yea–jer Chen, etc., Appl. Phys. Lett., vol. 53, No. 17, Oct. 24, 1988, pp. 1591–1592.

* cited by examiner

*Primary Examiner*—Cuong Nguyen
(74) *Attorney, Agent, or Firm*—Dickstein Shapiro Morin & Oshinsky LLP

(57) ABSTRACT

A method of depositing a platinum based metal film by CVD deposition includes bubbling a non-reactive gas over an organic platinum based metal precursor until the non-reactive gas is saturated with the precursor. The platinum based metal film is deposited onto a substrate in a CVD deposition chamber in the presence of both oxygen and nitrous oxide at a predetermined temperature and under a predetermined pressure. The resulting film is consistently smooth and has good step coverage.

8 Claims, 11 Drawing Sheets

CONTINUOUS GOOD STEP COVERAGE CVD PLATINUM METAL DEPOSITION

This application is a divisional of application Ser. No. 09/121,528 filed on Jul. 23, 1998, which is hereby incorporated by reference.

FIELD OF THE INVENTION

The invention relates generally to the chemical vapor deposition (CVD) of platinum group metals on an integrated circuit structure as a continuous film and with good step coverage. The invention also relates to integrated circuits having a platinum group metal layer, used, for example, as the lower electrode in a capacitor.

DISCUSSION OF RELATED ART

Because of their high corrosion resistance, microelectronic devices having platinum group metals are desired in applications where great reliability is desired and also where a corrosive atmosphere may be present. It is desired to develop a process for continuous good step coverage using platinum group metals.

The invention relates to the formation of a continuous film layer of platinum group metal by CVD. The invention may find many uses where a thin uniform layer of platinum group metal is needed. For example, the invention is useful in the computer microchip industry, such as for the undercoating electrode of a dielectric memory in a semiconductor device. The invention relates to a chemical vapor deposition method to deposit the platinum group metal onto a surface. The starting material for preparation of the platinum group metal film may be any organic platinum group metal precursor suitable for deposition of the platinum group metal.

Unfortunately, the conventional methods of depositing platinum films suffer drawbacks in that these methods are unable to consistently create a continuous uniformly thin platinum film that additionally has good step coverage. These conventional prior methods include vacuum deposition methods, sputtering methods and even chemical vapor deposition. Even in the conventional chemical vapor deposition methods it is difficult to create a continuous uniform platinum film and one with good step coverage.

This is likely due to the fact that when conventional platinum precursors are used in the conventional chemical vapor deposition methods, it is difficult to control the nucleation rate of the platinum films. At the outset of the platinum deposition process, the nucleation rate of the platinum film onto the surface of the substrate is very slow; however, once nucleation does begin the deposition rate of the platinum film onto the surface increases significantly. In fact, it is difficult to control or even slow the rate of deposition once the conventional methods begin depositing platinum onto the surface of the substrate. In the conventional methods therefore, it is difficult to begin the deposition process and even more difficult to control the deposition rate so as to arrive at a uniform thin platinum film having good step coverage.

In semiconductor processing, controlling the rate of deposition of a film is one important characteristic to a processing method. The conventional platinum deposition methods are unable to consistently control the deposition rate of the platinum film so as to consistently arrive at a platinum film that has sufficient physical properties to be useful in integrated circuits.

One example of the use of a platinum metal according to the conventional methods is discussed with reference to FIG. 12. A platinum layer 210 is deposited onto the surfaces of a deep container capacitor 200. The platinum layer 210 is formed by CVD deposition using a conventional platinum precursor. As the process begins, a platinum film 210 forms on the upper layer 220 of the capacitor 200. Since it is difficult to control the deposition rate of the platinum layer 210, the platinum layer 210 quickly forms a thick layer on the upper layer 220 of the capacitor 200. As a result, the quickly formed platinum layer 210 pinches together over the opening 230 in the capacitor 200 and very little platinum is able to form on the inside walls 240 or the bottom 250 of the capacitor 200. Thus, in this process, an inconsistent platinum film is formed on the inside walls 240 and the bottom 250 of the capacitor 200 without good step coverage.

One prior solution to increase the smoothness of the film deposited was to increase the temperature at which the metal is deposited. When the temperature at which the conventional CVD process operates is increased, the growth rate of the platinum also increases. While increasing the temperature does result in a smoother film, the increased temperature also increases the deposition rate, resulting in poor step coverage, as previously described. If the temperature of the CVD process is decreased, the growth rate of the platinum also decreases, resulting in better step coverage; however, when the temperature of the CVD process is decreased the carbon content of the film increases, resulting in poor film quality.

To reduce the carbon content of the film, the conventional methods added oxygen to the CVD process. The oxygen removed some of the carbon from the platinum film; however, the oxygen also increased the deposition rate of the platinum resulting in a film similar to the high temperature deposited film described above. Thus, the conventional methods are unable to achieve both good step coverage and a smooth continuous film, which is especially important in the manufacture of an integrated circuit.

SUMMARY OF THE INVENTION

The present invention overcomes the drawbacks of the conventional methods and provides a CVD method that produces a smooth, uniform, continuous film of a platinum group metal that also has good step coverage. The invention includes the addition of nitrous oxide ($N_2O$) and oxygen in combination as a component during the CVD process in order to control the deposition rate of the platinum group metal, which results in a continuous film having good step coverage.

The invention provides a process for depositing a platinum metal on a substrate which includes the steps of flowing a gas having saturated therein a platinum precursor over the substrate at a selected temperature and pressure in the presence of both oxygen ($O_2$) and nitrous oxide ($N_2O$). The selected operating temperature is a temperature at which the platinum group metal deposits on the substrate, but less than a temperature at which the platinum group metal fails to smoothly deposit on the substrate. The pressure at which the process operates is a pressure at which the platinum group metal will deposit on the substrate in a continuous film while maintaining good step coverage. By carrying out this process, a platinum group metal film may be deposited on the exposed portions of the substrate in a uniform film.

The above and other advantages and features of the invention will be more clearly understood from the following detailed description which is provided in connection with the accompanying drawings.

DETAILED DESCRIPTION OF THE PREFERRED EMBODIMENTS

Figure 1:
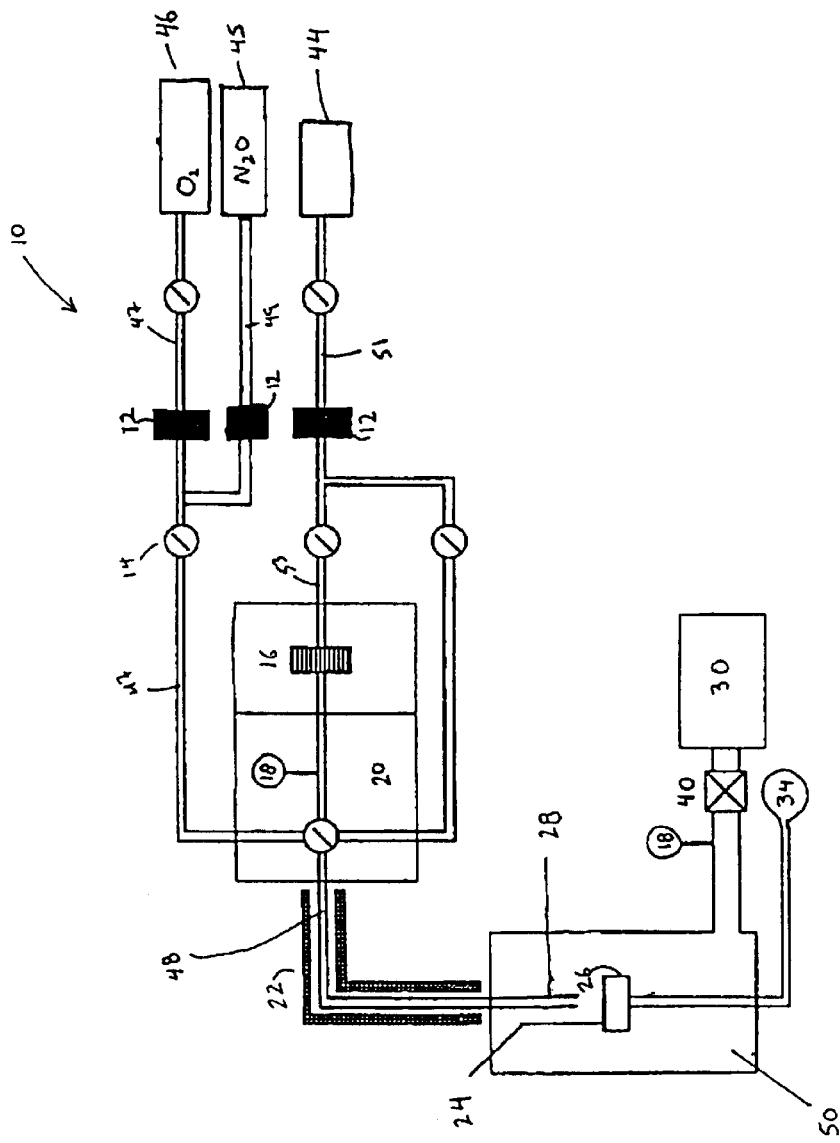
FIG. 1 is a schematic view of one embodiment of an apparatus used in the present invention.

The platinum group metals which can be deposited onto the surface of a substrate according to the present invention include Ru, Rh, Pd, Os, Ir or Pt or mixture thereof. These platinum group metals are deposited by bubbling an organic platinum group metal precursor containing the desired platinum group metal into a non-reactive flow gas. Preferably the platinum group metal is platinum.

The organic platinum group metal precursor may be any suitable organic compound which will allow the metal to deposit from the gas phase onto a substrate under CVD conditions. The organic precursor are may be, for example, cyclopentadienyl trimethylplatinum (IV), $(C_5H_5)Pt(CH_3)_3$, (hereinafter abbreviated as "(Cp)PtTM") or a derivative thereof such as, methylcyclopentadienyl trimethylplatinum $CH_3(C_5H_5)Pt(CH_3)_3$ (hereinafter abbreviated as "Me(Cp)PtTM," platinum beta-diketonates, platinum bis-(acetylacetonate), dimethyl platinum cyclopentadienide or dialkyl platinum dienes. Preferably the organic platinum precursors are (Cp)PtTM or Me(Cp)PtTM. Suitable organic precursors for the Ru, Rh, Pd, Os and Ir metals may also be used.

The carrier gas into which the organic platinum group precursor is bubbled may be any suitable gas, preferably a non-reactive gas. The purpose of the carrier gas is to transport the organic platinum group precursor to the CVD deposition chamber in gaseous form so that the metal can be deposited onto the surface of a substrate in the chamber. Suitable non-reactive gases include helium, nitrogen, neon, argon, krypton, and xenon. Preferably the carrier gas is selected from helium, argon and nitrogen, most preferably helium. The carrier gas may also comprise mixtures of the non-reactive gases.

The non-reactive gas, together with the organic platinum group precursor dissolved therein, is fed into the CVD deposition chamber at a rate of about 50 to about 500 standard cubic centimeters per minute ("sccm"), more preferably from about 100 to about 250 sccm, most preferably about 200 sccm. The flow rate of the non-reactive gas to be fed to the CVD deposition chamber is determined based on platinum group metal to be deposited as well as the substrate on which the metal is to be deposited. The non-reactive gas flow rate may also vary depending upon the temperature and pressure at which the deposition takes place, or the bubbler temperature.

The flow gas is fed to the CVD deposition chamber together with both oxygen and nitrous oxide. The oxygen/nitrous oxide mixture includes from about 5% by volume to about 95% by volume of oxygen and from about 95% by volume to about 5% by volume of nitrous oxide. Preferably the gas mixture includes from about 40% by volume to about 60% by volume of oxygen and from about 60% by volume to about 40% by volume of nitrous oxide, most preferably about 50% by volume of oxygen and about 50% by volume of nitrous oxide. The exact percentages of each gas to be fed to the CVD deposition chamber is determined depending upon the platinum group metal to be deposited as well as the substrate on which the metal is to be deposited. The gas mixture may also vary depending upon the temperature and pressure at which the deposition takes place. While not wishing to be bound by theory, it is believed that if the deposited film is rough, the percentage of oxygen should be decreased and the percentage of nitrous oxide in the mixture should be increased to provide a continuous film.

The oxygen and nitrous oxide are fed to the CVD deposition chamber at a rate from about 1500 sccm to about 2500 sccm, depending upon the mixture of the gases. Preferably the gases are fed in a 50/50 mixture to the CVD deposition chamber. Thus, the rate at which the gases are fed to the CVD chamber is preferably about 900 sccm oxygen and 900 sccm nitrous oxide.

The temperature at which the CVD deposition process is operated can range from about 200° C. to about 600° C., preferably from about 250° C. to about 300° C., most preferably about 275° C. The pressure at which the CVD deposition process is operated can range from about 1 to about 1000 Torr. Preferably the pressure is from about 10 Torr to about 50 Torr, most preferably about 15 to about 30 Torr. The temperature and pressure of the CVD deposition process depends upon the platinum group metal which is to be deposited as well as the substrate on which the metal is to be deposited as well as the other reaction parameters.

The CVD deposition of the invention is useful for depositing any of the platinum group metals onto the surface of any substrate. While the process is useful for deposition of the platinum group metal onto any surface, the surface on which the platinum group metal is to be deposited is preferably those materials found in the fabrication of integrated circuits. For example, a platinum group metal may be deposited according to the invention onto borophosphosilicate glass (BPSG), silicon, TiN, Ti, oxides, polysilica glass (PSG), $Si_3N_2$, polysilicon or silicide.

The terms wafer or substrate used in the description include any semiconductor-based structure having an exposed silicon surface in which to form the contact electrode structure of this invention. Wafer and substrate are to be understood as including silison-on insulator (SOI)

technology, silicon-on-sapphire (SOS) technology, doped and undoped semiconductors, epitaxial layers of silicon supported by a base semiconductor foundation, and other semiconductor structures. Furthermore, when reference is made to a wafer or substrate in the following description, previous process steps may have been utilized to form regions/junctions in the base semiconductor structure or foundation.

The method for CVD deposition a platinum group metal according to the present invention may deposit a continuous film of the metal having good step coverage to a thickness of about 50 to about 1000 Angstroms, preferably about 500 to about 700 Angstroms. In order to deposit the platinum group metal, the substrate should remain in the CVD deposition chamber for a time ranging from about 45 to about 1000 seconds, preferably from about 75 to about 150 seconds, most preferably about 100 seconds. The time for the substrate to remain in CVD deposition chamber in accordance with the present invention will be determined based on the platinum group metal which is to be deposited as well as the substrate on which the metal is to be deposited. The timing of the reaction is also dependent upon the other reaction parameters, such as the flow rate of the saturated organic precursor flow gas, the temperature and the pressure at which reaction takes place or whether the injection of the materials into the deposition apparatus is in liquid or gaseous form.

An exemplary apparatus used in the process for depositing a platinum group metal according to one embodiment of the present invention is described below. It is to be understood, however, that this apparatus is only one example of many possible different apparatuses that may be used to deposit the platinum group metal by chemical vapor deposition according to the invention. The invention is not intended to be limited by the particular apparatus described below.

Referring now to FIG. 1, the apparatus is generally indicated by reference number 10. The apparatus 10 includes an oxygen gas source 46 which supplies oxygen to the apparatus 10 and a nitrous oxide gas source 45 which provides nitrous oxide to the apparatus 10. The flow rate of the oxygen and nitrous oxide are controlled by flow controllers 12. The flow controllers 12 enable the apparatus to vary the mixture of oxygen and nitrous oxide gas that is fed to the apparatus depending upon the other reaction coordinates, the metal to be deposited as well as the surface onto which the metal is to be deposited. The nitrous oxide flows through conduit 49 through the flow controller 12 and mixes with the oxygen, which is carried through conduit 47, into the vessel 20.

While the apparatus shows two gas sources 45 and 46, it should be understood that the apparatus may contain a single gas source where the desired proportion of oxygen and nitrous oxide gases were mixed prior to the gas source of the apparatus.

The apparatus 10 also includes a flow gas source 44. The flow gas source 44 provides flow gas into which the organic platinum group metal precursor will be bubbled into for deposition in the CVD deposition chamber 50. The flow gas flows through conduit 51 past flow controller 12 and into the vessel 20. The flow gas may be any noble gas which is capable of carrying the organic platinum group metal precursor into the deposition chamber, preferably the flow gas is helium, argon or nitrogen.

The flow gas flows through conduit 53 past the source bubbler 16 where the flow gas becomes saturated with the organic platinum group metal precursor. The saturated flow gas is then mixed with oxygen and nitrous oxide and fed to the CVD deposition chamber 50 through conduit 48. The gases flowing though conduit 48 are heated to a predetermined temperature by heater 22 before entering the CVD deposition chamber 50. The gas flows through nozzle 28 into the CVD deposition chamber 50. The CVD deposition chamber is also heated to a predetermined reaction temperature by heat source 34.

The temperature in the CVD deposition chamber 50 is measured by a thermocouple 24 which is in contact with the substrate 26. Pressure in the CVD deposition chamber 50 is controlled by the pump 30 and the pump valve 40. The pressure in the CVD deposition chamber can be determined by the pressure gauge 18. A platinum group metal film is then deposited on the substrate 26 from the gas. Once the substrate 26 has been in the CVD deposition chamber 50 for a predetermined period of time, the substrate 26 is removed from the CVD deposition chamber 50.

The invention provides a method of deposition of platinum group metals in the presence of both oxygen and nitrous oxide. While not wishing to be bound by theory, it is believed that the addition of the nitrous oxide to the oxygen modulates the growth of the platinum group metal film. It is believed that this modulation of growth of the film occurs because the nitrous oxide is a weaker oxidizing agent than the oxygen and the combination of these two oxidizing gases modulates the growth of the platinum group metal film while reducing the carbon content in the film. Thus the method creates a platinum group metal film that is both consistently smooth and has good step coverage.

The combination of good step coverage and a continuous film is useful for deposition in integrated circuits, especially for the top and bottom electrode in a capacitor in a memory cell. In integrated circuit manufacturing, there is continuous pressure to decrease the size of individual cells and increase memory cell density to allow more memory to be squeezed onto a single memory chip. However, it is necessary to maintain a sufficiently high storage capacitance to maintain a charge at the refresh rates currently in use even as cell size continues to shrink. This requirement has led manufacturers to turn to three dimensional capacitor designs, including trench and stacked capacitors. A particular type of stacked capacitor is a container capacitor. In a container capacitor, it is important that the material forming the electrode layers of the capacitor, specifically the lower electrode, be consistently deposited with good step coverage so that the memory circuit can take advantage of the capacitance of the deep container walls. The present invention provides a method for forming films of platinum based metals that can meet these requirements.

The invention is further explained with reference to the following examples. This invention is not intended to be limited by the particular examples described below.

EXAMPLE 1

Platinum was deposited onto an 8" wafer in a 5000 L chamber by adding Me(Cp)PtTM under the following conditions:

| Temperature (° C.) | Pressure (Torr) | O₂ (sccm) | N₂O sccm |
|---|---|---|---|
| 275 | 30 | 900 | 900 |

The platinum was deposited with a helium carrier flow rate of 200 sccm for 100 seconds. This resulted in a continuous deposition of platinum on the wafer.

EXAMPLE 2

Platinum was deposited onto a silicon surface by adding Me(Cp)PtTM under the following conditions:

| Temperature (° C.) | Pressure (Torr) | O₂ (sccm) | N₂O sccm |
|---|---|---|---|
| 275 | 30 | 900 | 900 |

Figure 2:
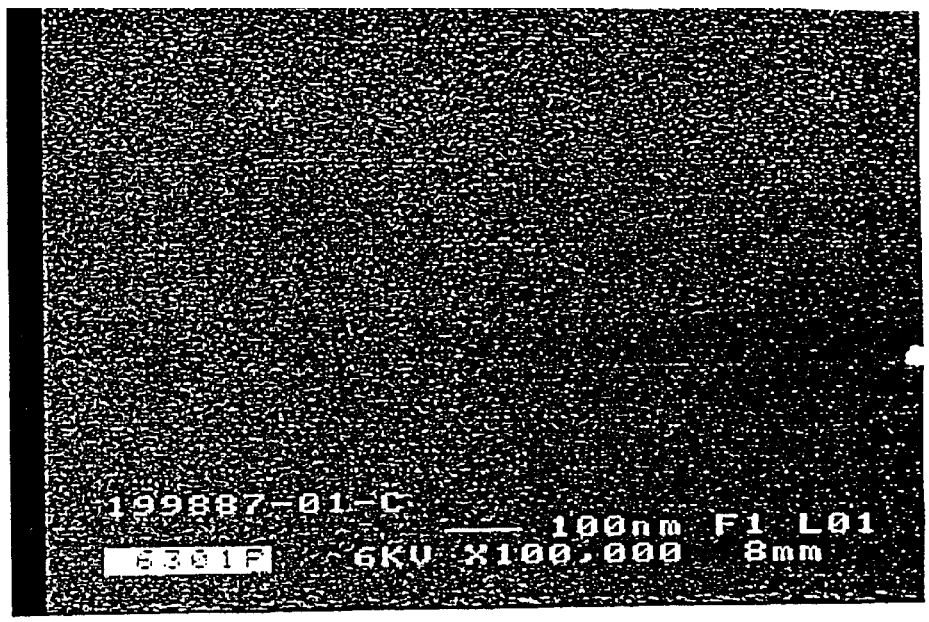
FIG. 2 is a microscopic photograph of a platinum film deposited on silicon (Si) according to a method of the present invention.

The platinum precursor was saturated with a helium carrier. The platinum was deposited with a helium carrier flow rate of 200 sccm for 100 seconds. This resulted in a continuous deposition of platinum on the silicon. The resultant film had a thickness of 175 Angstroms. The continuous film can be seen in FIG. 2.

EXAMPLE 3

Platinum was deposited onto a BPSG surface by adding Me(Cp)PtTM under the following conditions:

| Temperature (° C.) | Pressure (Torr) | O₂ (sccm) | N₂O sccm |
|---|---|---|---|
| 275 | 30 | 900 | 900 |

The platinum precursor was saturated with a helium carrier in the presence of argon. The platinum was deposited with a helium carrier flow rate of 200 sccm for 150 seconds. This resulted in a continuous deposition of platinum onto the BPSG. The resultant film had a thickness of 298 Angstroms and a 69% step coverage.

COMPARATIVE EXAMPLE 1

Platinum was deposited onto a silicon surface by adding Me(Cp)PtTM under the following conditions:

| Temperature (° C.) | Pressure (Torr) | O₂ (sccm) | N₂O sccm |
|---|---|---|---|
| 400 | 15 | 900 | 0 |

Figure 3:
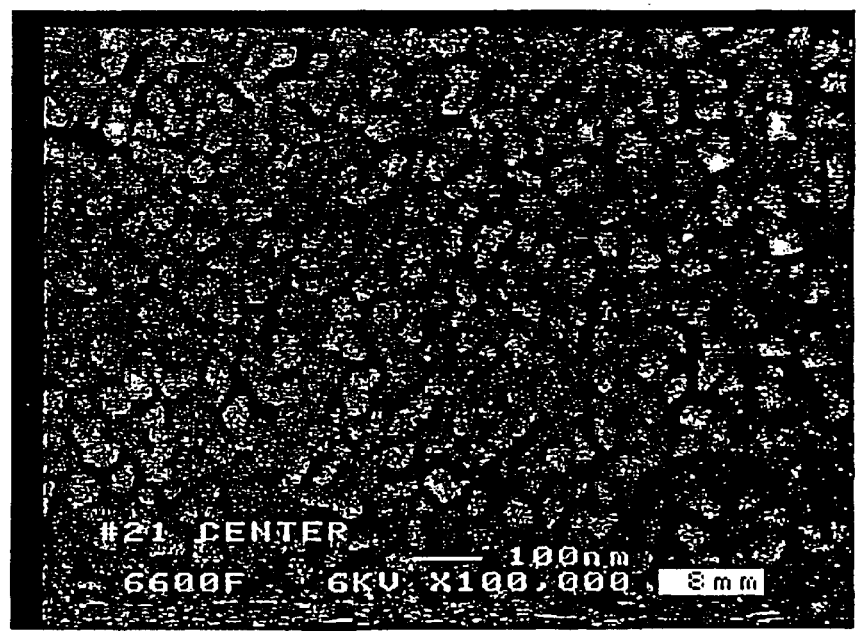
FIG. 3 is a microscopic photograph of a platinum film deposited on Si according to a conventional method.

The platinum precursor was saturated with a helium carrier. The platinum was deposited with a helium carrier flow rate of 200 sccm for 120 seconds. This resulted in a rough deposition of platinum on the silicon. The resultant rough film had a thickness of 960 Angstroms. The rough film can be seen in FIG. 3.

EXAMPLE 4

A lower electrode for a capacitor in a memory cell was formed of platinum according to the present invention.

Figure 4:
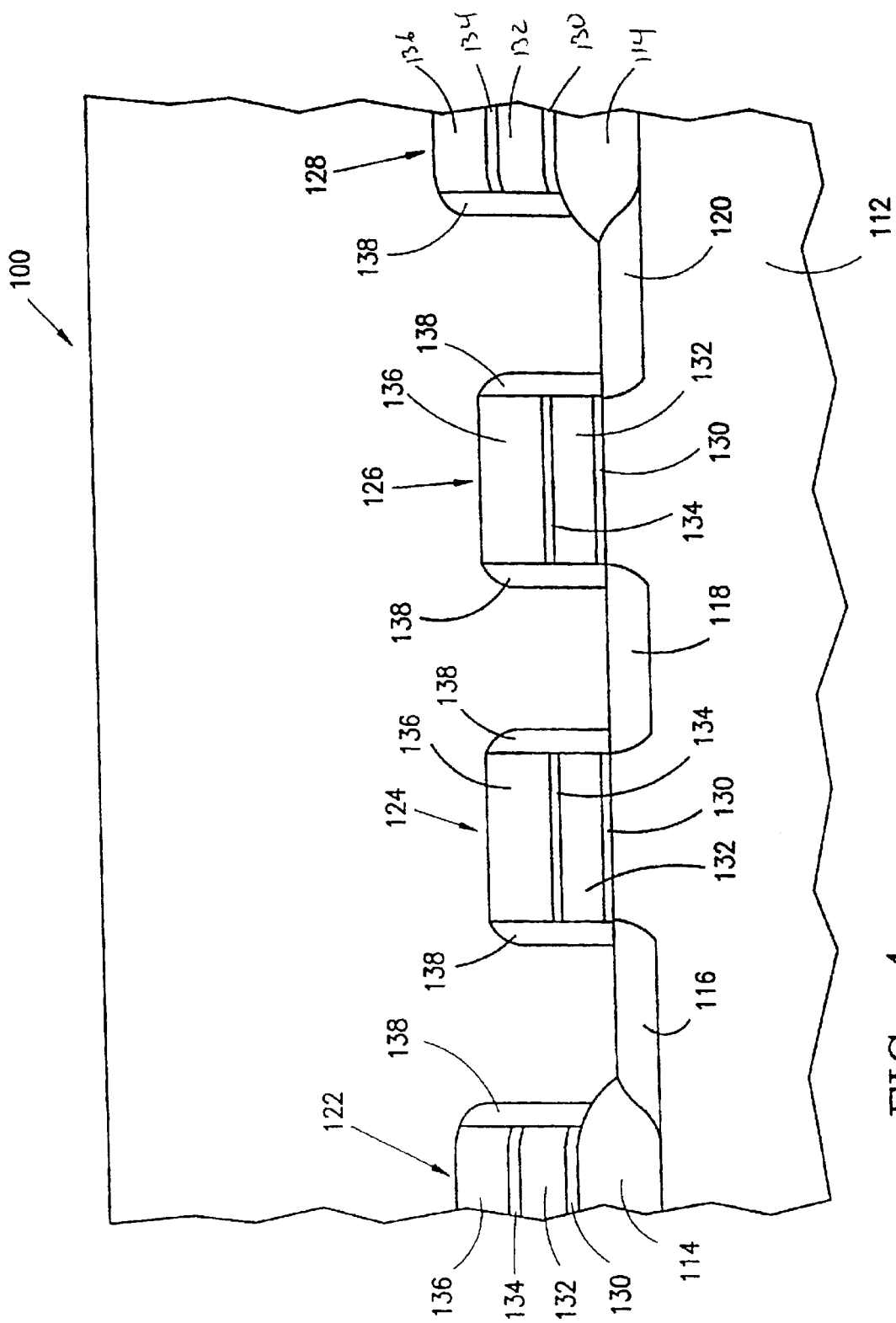
FIG. 4 is a diagrammatic cross-sectional view of a portion of a semiconductor wafer at an early processing step according to one embodiment of the present invention.

Referring to FIG. 4, a semiconductor wafer fragment at an early processing step is indicated generally by reference numeral 100. The semiconductor wafer 100 is comprised of a bulk silicon substrate 112 with field isolation oxide regions 114 and active areas 116, 118, 120 formed therein. Word lines 122, 124, 126, 128 have been constructed on the wafer 100 in a conventional manner. Each word line consists of a lower gate oxide 130, a lower poly layer 132, a higher conductivity silicide layer 134 and an insulating silicon nitride cap 136. Each word line has also been provided with insulating spacers 138, which are also composed of silicon nitride.

Figure 5:
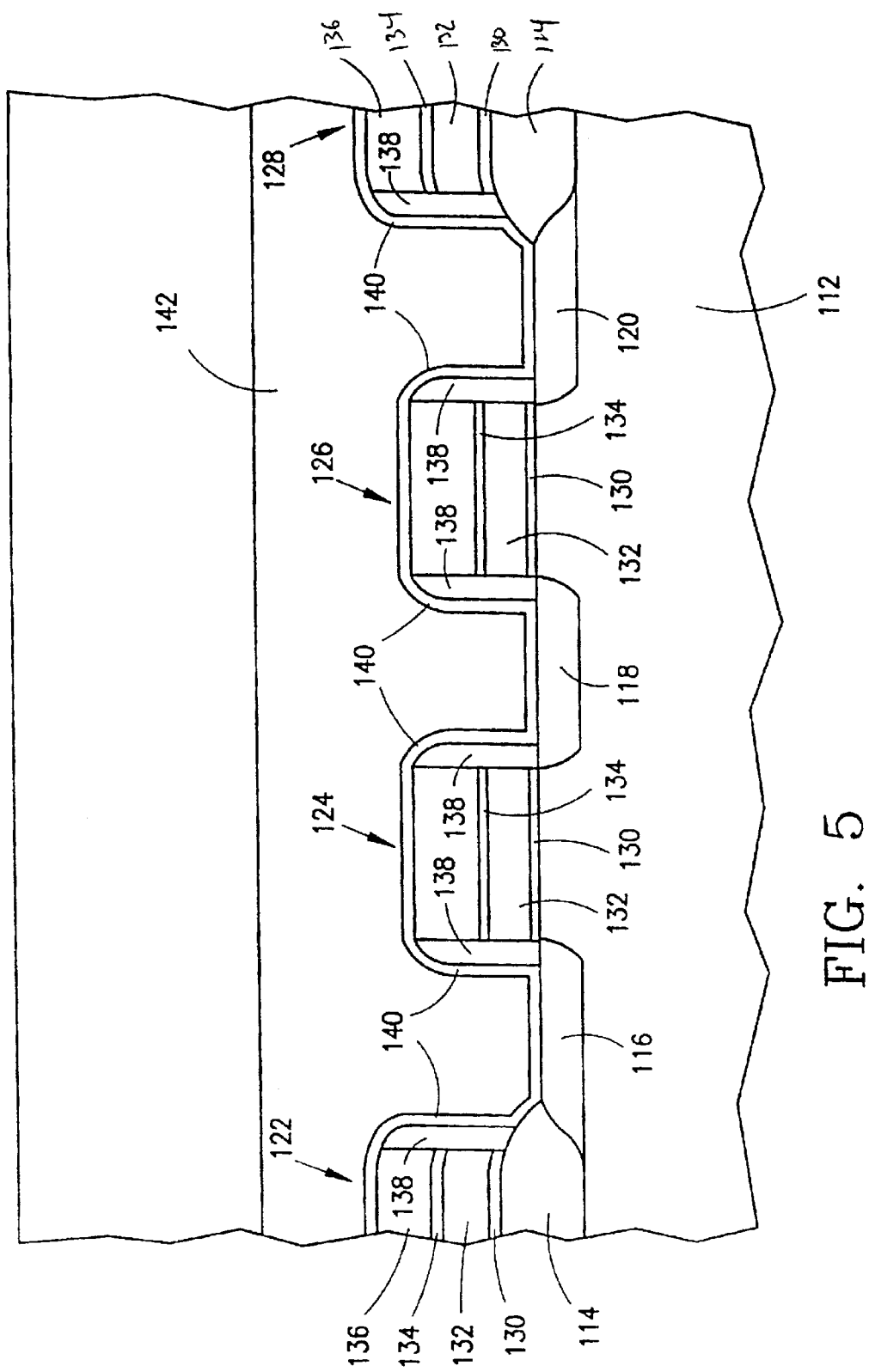
FIG. 5 is a diagrammatic cross-sectional view of a portion of a semiconductor wafer at a processing step subsequent to that shown in FIG. 4.

Referring now to FIG. 5, a thin layer 140 of nitride or TEOS (tetraethyl orthosilicate) is then provided atop the wafer 100. Next a layer of insulating material 142 is deposited. The insulating material preferably consists of BPSG.

The insulating layer 142 is subsequently planarized by chemical-mechanical polishing (CMP).

Figure 6:
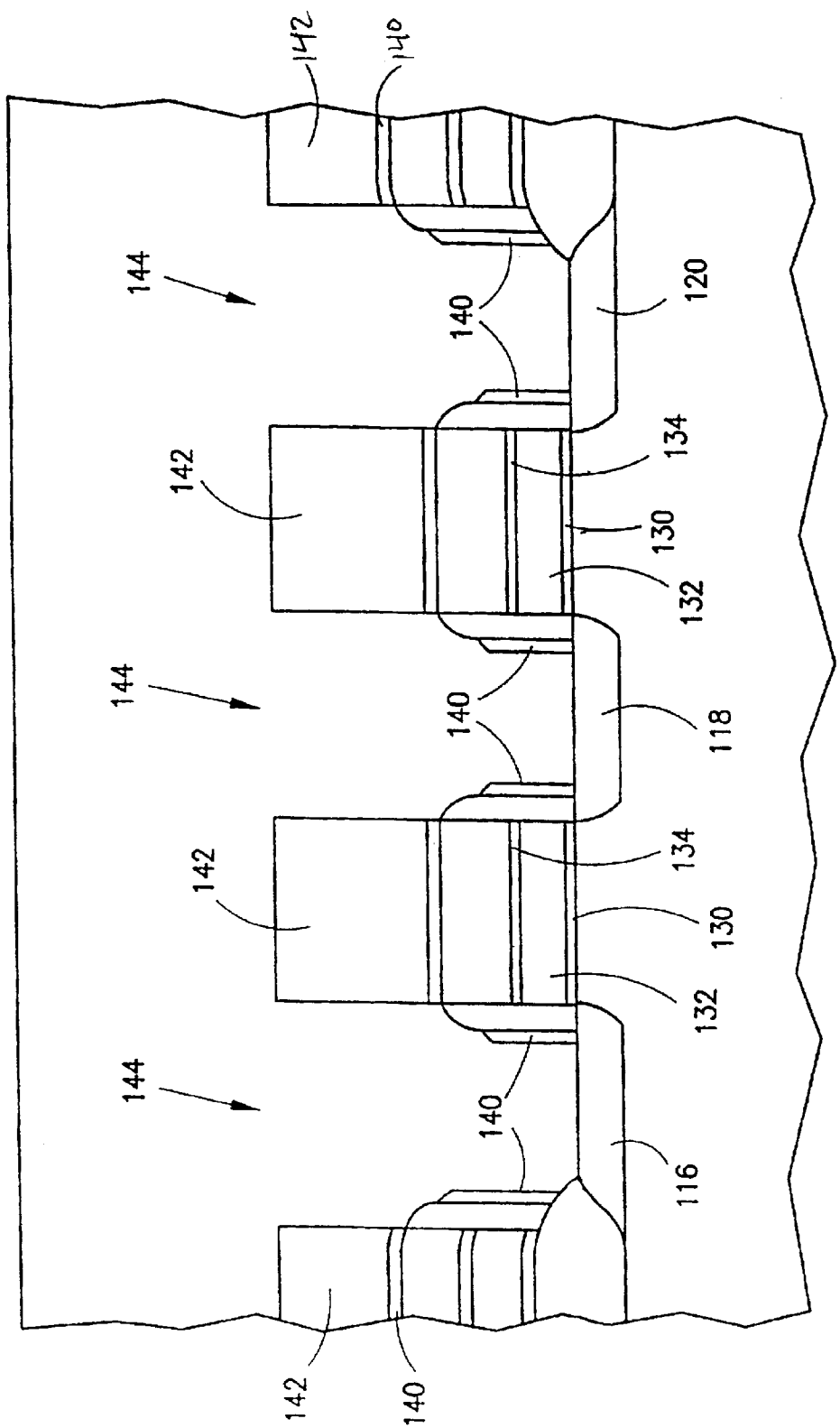
FIG. 6 is a diagrammatic cross-sectional view of a portion of a semiconductor wafer at a processing step subsequent to that shown in FIG. 5.

Referring now to FIG. 6, plug openings have been formed through the insulating layer 142. The plug openings 144 are formed through the insulating layer 142 by photomasking and dry chemical etching the BPSG relative to the thin nitride layer 140.

Figure 7:
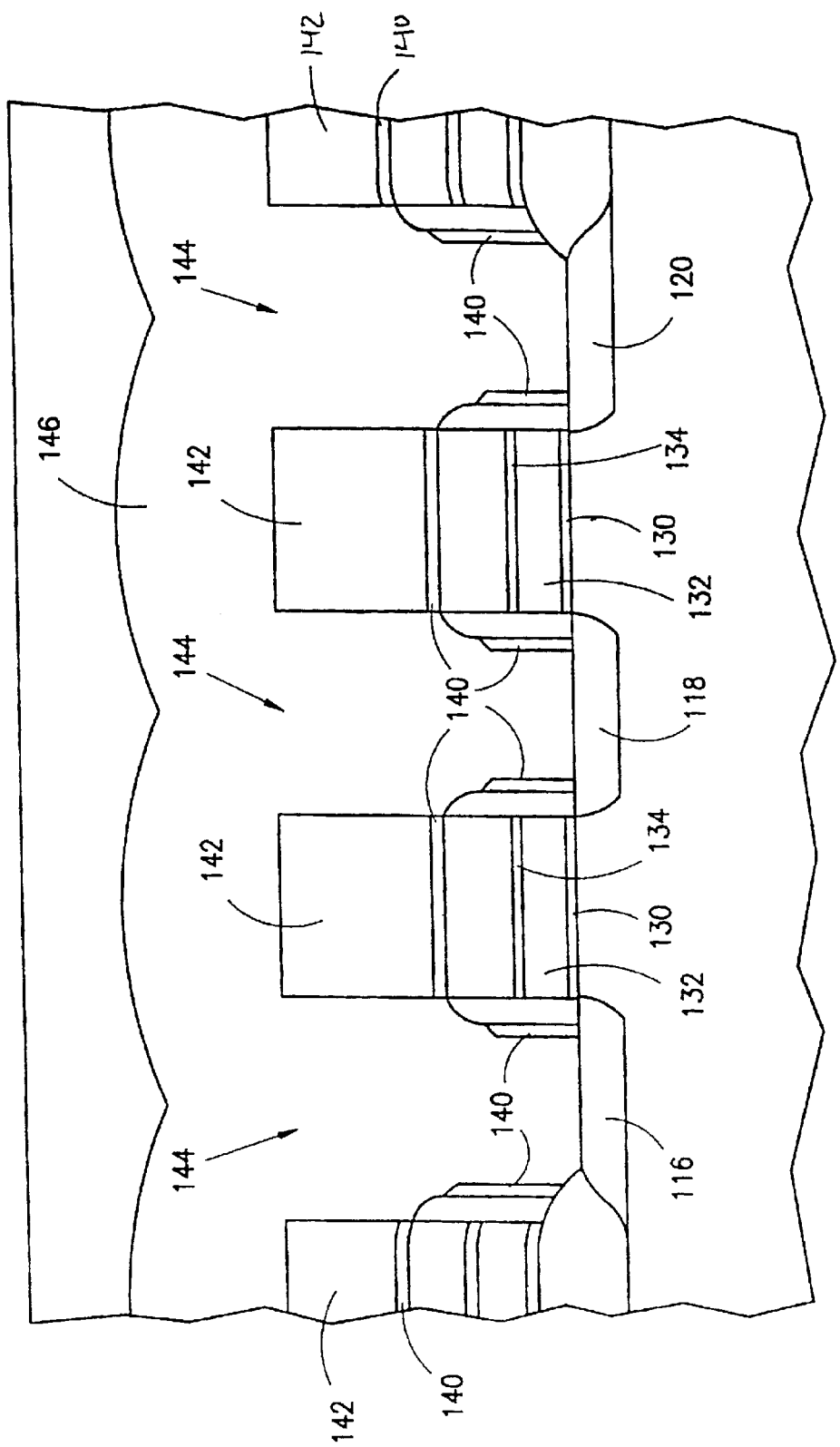
FIG. 7 is a diagrammatic cross-sectional view of a portion of a semiconductor wafer at a processing step subsequent to that shown in FIG. 6.
Figure 8:
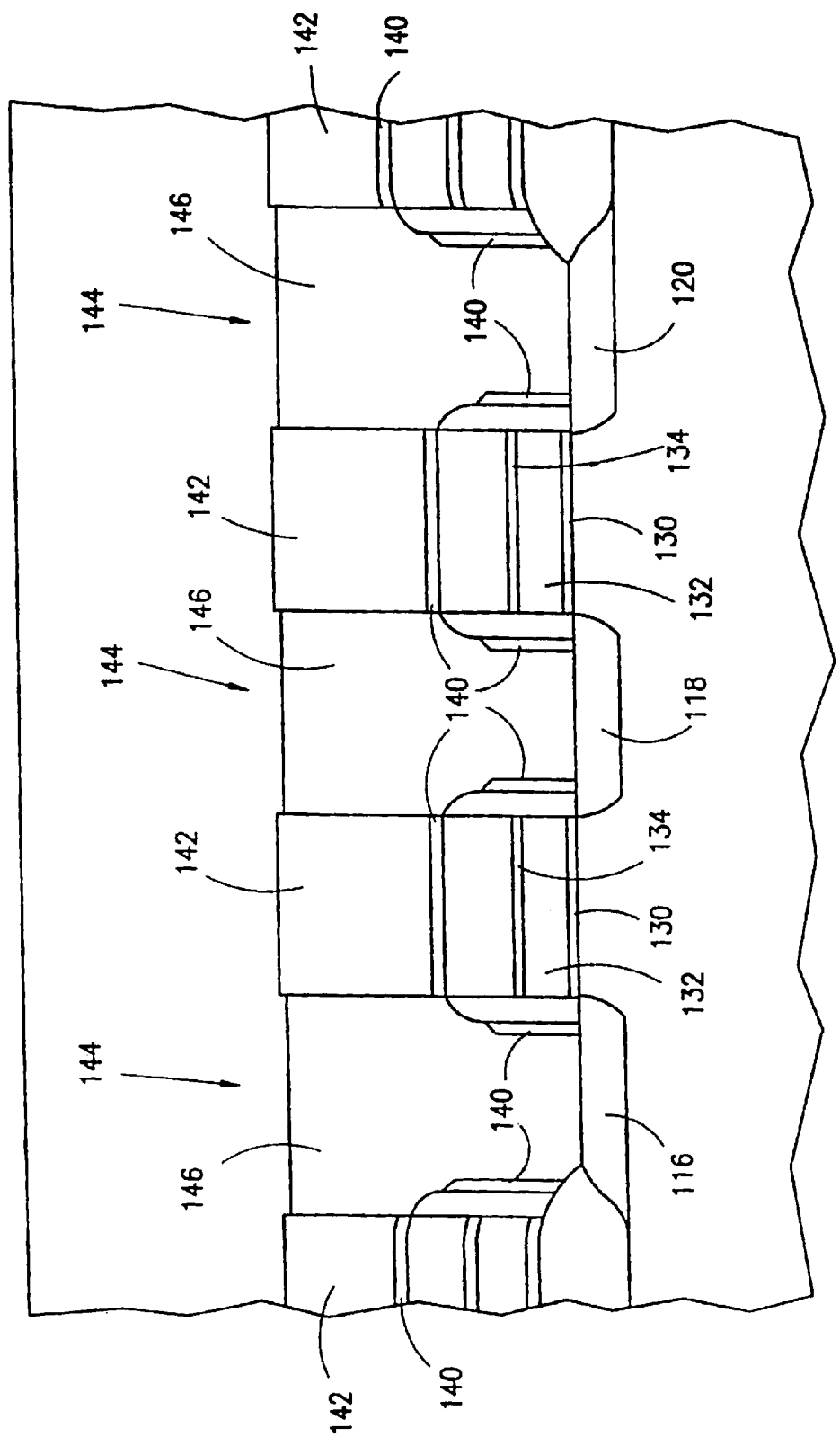
FIG. 8 is a diagrammatic cross-sectional view of a portion of a semiconductor wafer at a processing step subsequent to that shown in FIG. 7.

Referring now to FIG. 7, a conductive plug layer 146 is formed. An example of the material used to form conductive plug layer 146 is in situ arsenic or phosphorous doped poly. Referring now to FIG. 8, the conductive plug layer 146 is dry etched (or chemical-mechanical polished) to a point just below the upper surface of the BPSG layer 142 such that the remaining material of the conductive plug layer 146 forms electrically isolated plugs 146 over the active areas 116, 118, 120.

Figure 9:
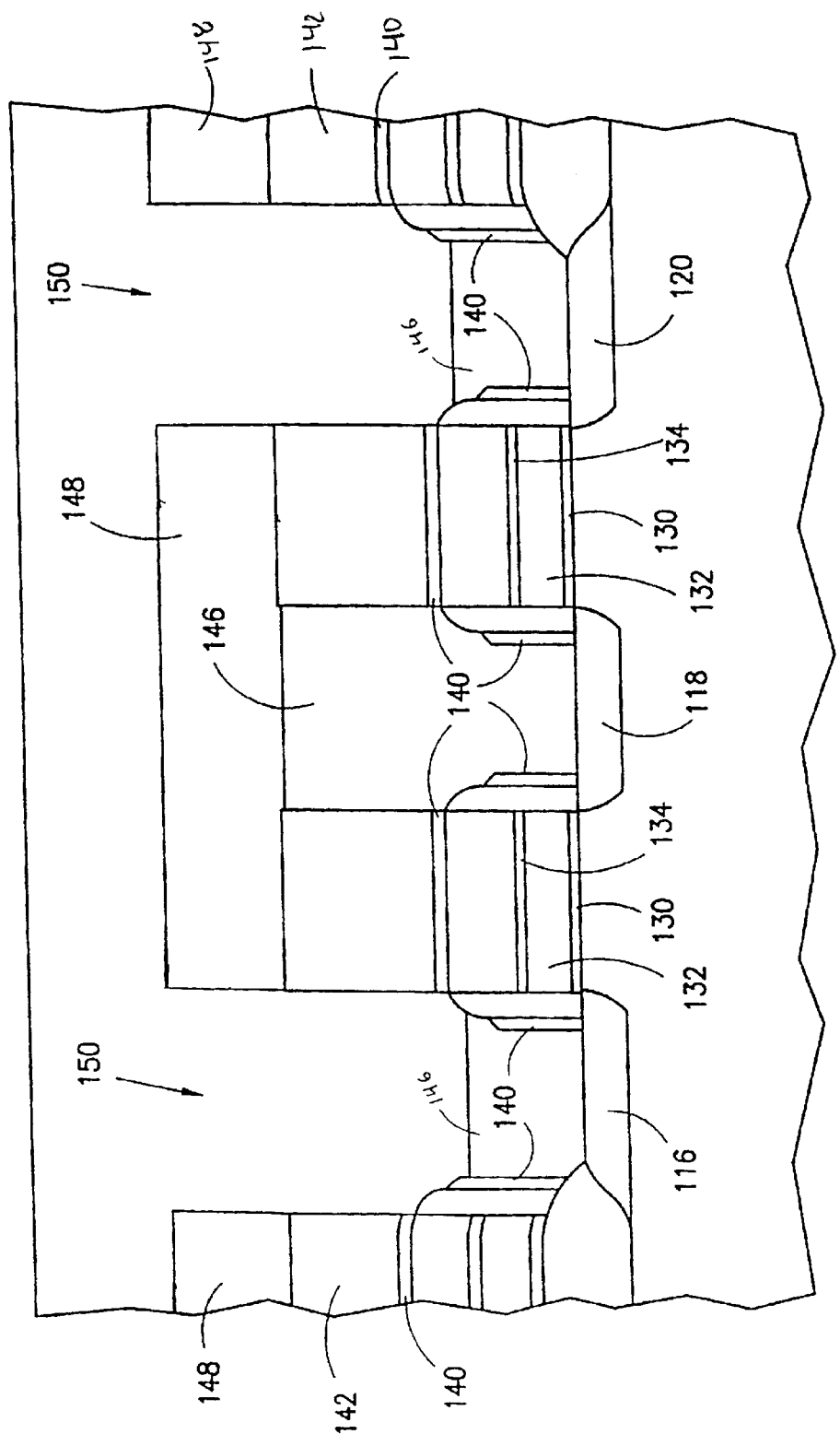
FIG. 9 is a diagrammatic cross-sectional view of a portion of a semiconductor wafer at a processing step subsequent to that shown in FIG. 8.

Still with reference to FIG. 8, an additional layer 148 of BPSG is then deposited on the structure. Referring now to FIG. 9, capacitor openings 150 are then formed in the BPSG layer 148 by photomasking and dry chemical etching. The height of the plugs, as defined by the conductive plug layer 146 over the non-bit line active areas 116, 120 is also reduced by this step.

Figure 10:
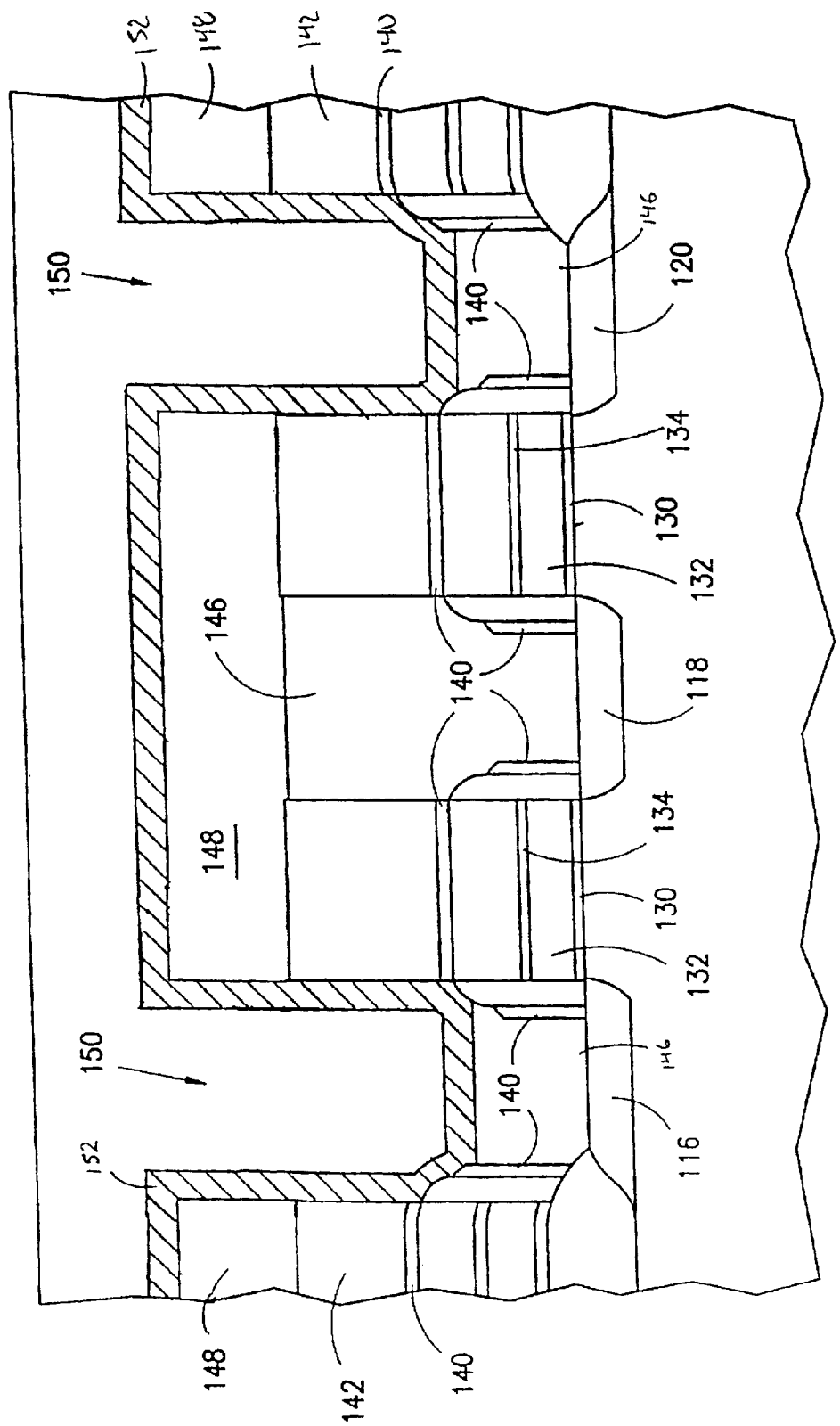
FIG. 10 is a diagrammatic cross-sectional view of a portion of a semiconductor wafer at a processing step subsequent to that shown in FIG. 9 showing a platinum lower electrode.

Referring now to FIG. 10, a platinum layer 152 that will form the lower electrode of the capacitor is deposited. The platinum layer 152 is deposited by chemical vapor deposition. The platinum is deposited by flowing 200 sccm of helium past an organic platinum precursor of Me(Cp)PtTM. The platinum is deposited in an atmosphere of 900 sccm O₂ and 900 sccm N₂O at a temperature of about 275° C. and a pressure of 30 Torr. The platinum is deposited with helium as the flow gas at a rate of 200 sccm for 100 seconds. The process formed a continuous platinum layer 152 with good step coverage.

Since the platinum layer 152 is resistant to oxidation it provides an excellent surface for the deposition of the high dielectric constant material. In addition, the platinum layer 152 protects the top surface of the poly plug 146 from strong oxidizing conditions during further deposition. Therefore platinum is used as the lower portion of the first electrode since it will not oxidize during subsequent deposition, etches or anneals.

Figure 11:
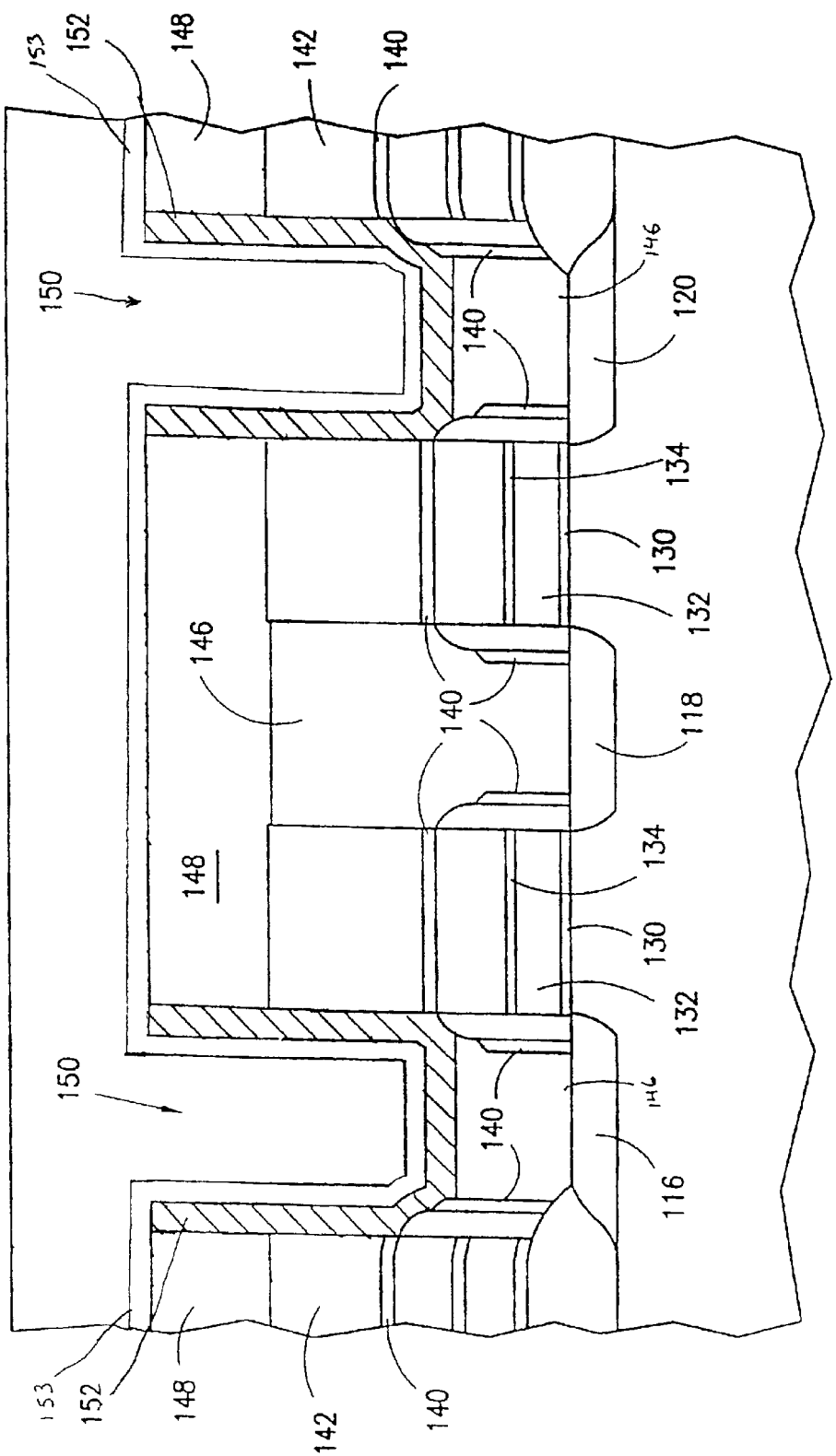
FIG. 11 is a diagrammatic cross-sectional view of a portion of a semiconductor wafer at a processing step subsequent to that shown in FIG. 10.
Figure 12:
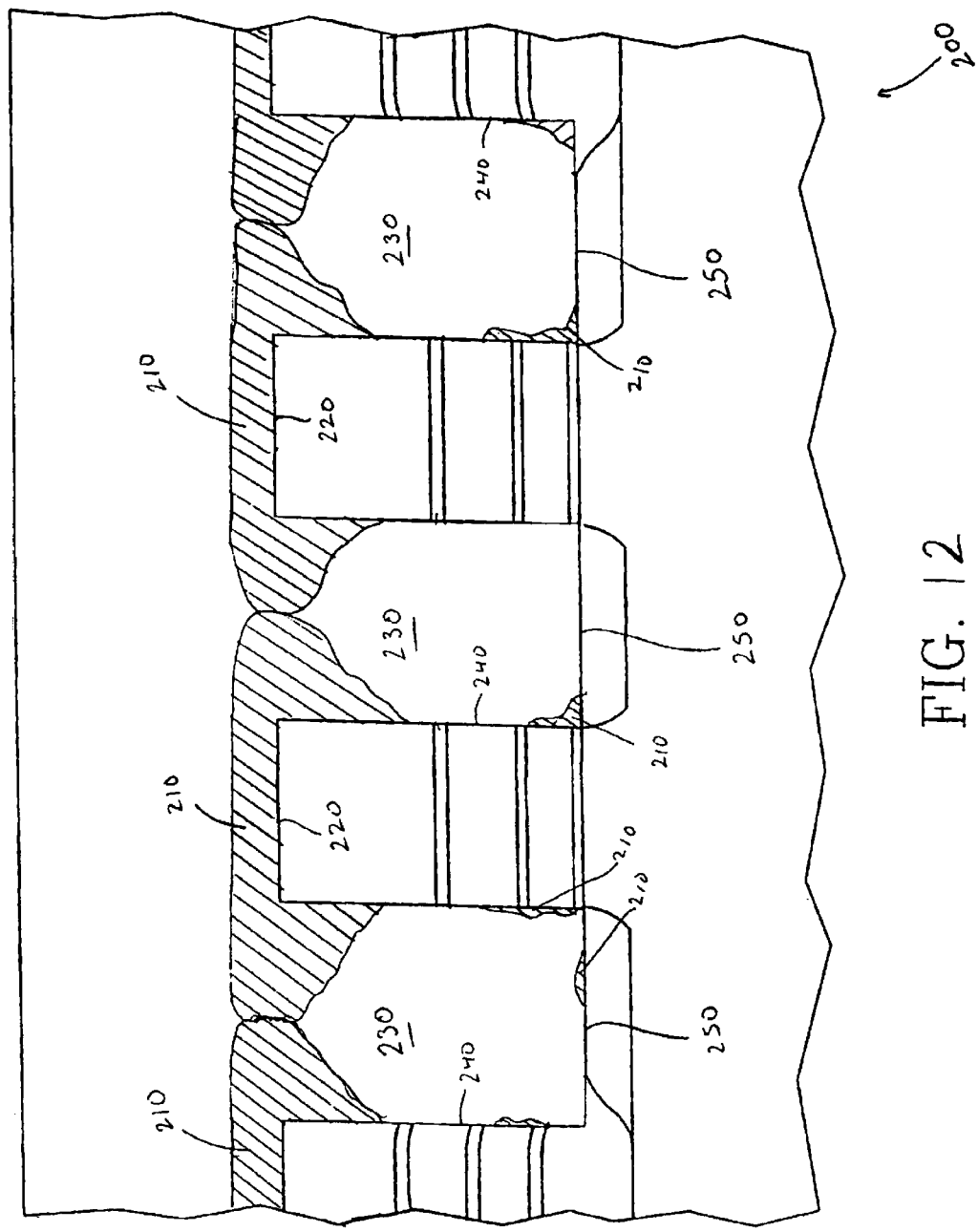
FIG. 12 is a diagrammatic cross-sectional view of a portion of a semiconductor wafer with a platinum layer deposited according to the conventional methods.

Referring to FIG. 11, the upper layer of the electrode 152 is removed from the top surface of the BPSG layer 148. Preferably this is done by CMP. A dielectric layer 153 is then deposited over the platinum layer 152. The dielectric layer 153 may also be formed of any dielectric material. A second electrode (not shown) is deposited over the dielectric layer 153 to complete the cell. Any suitable electrode material may be used, including but not limited to a platinum group metal deposited according to the present invention.

It should again be noted that although the invention has been described with specific reference to DRAM memory circuits and container capacitors, the invention has broader applicability and may be used in any integrated circuit requiring capacitors. Similarly, the process described above is but one method of many that could be used. Accordingly, the above description and accompanying drawings are only illustrative of preferred embodiments which can achieve the features and advantages of the present invention. It is not intended that the invention be limited to the embodiments shown and described in detail herein. The invention is only limited by the spirit and scope of the following claims.

What is claimed as new and desired to be protected by Letters Patent of the United States is:

1. A capacitor comprising:
    a first electrode and a second electrode, wherein at least one of said first and second electrodes is formed of a material selected from the group consisting of Ru, Rh, Pd, Os, Ir and Pt;
    a dielectric provided between said electrodes; and
    wherein at least one of said first and second electrodes comprises a uniformly thin and continuous platinum group metal having a uniform thickness of from about 50 Angstroms to about 1000 Angstroms, said platinum group metal deposited in gaseous form onto a substrate in a CVD deposition chamber with a flow rate of from about 50 to about 500 sccm in the presence of an oxygen and nitrous oxide mixture, wherein said mixture has a combined flow rate in the range of from about 1500 sccm to about 2500 sccm.

2. The capacitor according to claim 1, wherein said at least one of said first and second electrodes is platinum.

3. The capacitor according to claim 2, wherein said platinum electrode is the lower electrode.

4. A capacitor comprising:
    a first electrode and a second electrode, wherein at least one of said first and second electrodes is formed of a material selected from the group consisting of Ru, Rh, Pd, Os, Ir and Pt;
    a dielectric provided between said electrodes; and
    wherein at least one of said first and second electrodes comprises a uniformly thin and continuous platinum group metal having a uniform thickness of from about 500 Angstroms to about 700 Angstroms, said platinum group metal formed by depositing platinum in a CVD deposition chamber with a flow rate from about 50 to about 500 sccm in the presence of an oxygen and nitrous oxide mixture at a predetermined temperature and at a pressure of from about 10 to about 1000 Torr.

5. The capacitor according to claim 4, wherein said temperature is from about 2500 C. to about 3000 C.

6. The capacitor according to claim wherein said pressure is from about 15 to about 30 Torr.

7. The capacitor according to claim 4, wherein said platinum electrode is the lower electrode.

8. The capacitor according to claim 4, wherein said platinum electrode has a thickness of about 500 angstroms.

* * * * *

UNITED STATES PATENT AND TRADEMARK OFFICE
CERTIFICATE OF CORRECTION

PATENT NO. : 6,861,693 B2
DATED : March 1, 2005
INVENTOR(S) : Garo J. Derderian

It is certified that error appears in the above-identified patent and that said Letters Patent is hereby corrected as shown below:

Column 3,
Line 49, "are may" should read -- may --;

Column 5,
Line 9, "deposition a" should read -- deposition of a --;
Line 18, "in CVD" should read -- in a CVD --.

Column 10,
Line 24, "claim wherein" should read -- claim 4 wherein --.

Signed and Sealed this

Eleventh Day of October, 2005

JON W. DUDAS
*Director of the United States Patent and Trademark Office*